(12) United States Patent
Berkmann et al.

(10) Patent No.: US 9,497,876 B2
(45) Date of Patent: Nov. 15, 2016

(54) FASTENING SYSTEMS FOR POWER MODULES

(71) Applicant: BRUSA Elektronik AG, Sennwald (CH)

(72) Inventors: Martin Berkmann, Andelsbuch (AT); Katja Stengert, Lienz (CH)

(73) Assignee: BRUSA Elektronik AG, Sennwald (CH)

( * ) Notice: Subject to any disclaimer, the term of this patent is extended or adjusted under 35 U.S.C. 154(b) by 0 days.

(21) Appl. No.: 14/676,858

(22) Filed: Apr. 2, 2015

(65) Prior Publication Data

US 2015/0289404 A1    Oct. 8, 2015

(30) Foreign Application Priority Data

Apr. 2, 2014  (EP) ..................... 14163131

(51) Int. Cl.
*H05K 7/00*    (2006.01)
*H05K 7/02*    (2006.01)
*H01L 23/40*   (2006.01)
*H01L 23/31*   (2006.01)
*H01L 25/11*   (2006.01)
*H01L 23/00*   (2006.01)

(52) U.S. Cl.
CPC ............. *H05K 7/02* (2013.01); *H01L 23/3121* (2013.01); *H01L 23/4006* (2013.01); *H01L 25/115* (2013.01); *H01L 24/48* (2013.01); *H01L 2023/405* (2013.01); *H01L 2023/4043* (2013.01); *H01L 2023/4087* (2013.01); *H01L 2224/48247* (2013.01); *H01L 2924/1815* (2013.01)

(58) Field of Classification Search
CPC ............... H01L 23/4093; H01L 24/72; H01L 2924/1532; H01L 23/4006; Y10T 24/44026
See application file for complete search history.

(56) References Cited

U.S. PATENT DOCUMENTS 5,648,889 A  *  7/1997  Bosli ................... H01L 23/4006
                                                            257/717
5,834,842 A     11/1998  Majumdar et al.
(Continued)

FOREIGN PATENT DOCUMENTS

EP    0785575 A2    7/1997
EP    1536467 A2    6/2005
(Continued)

OTHER PUBLICATIONS

EPO search report and written opinion from priority EPO application EP14163131, dated Apr. 7, 2015 (in German).
(Continued)

*Primary Examiner* — Robert J Hoffberg
*Assistant Examiner* — Hung Dang

(57) ABSTRACT

Fastening systems for power modules including molded body (2) with flat surface (2a) bearing on supporting structure, and a plurality of protruding contact pins (3). A pressing element (5) presses a power module (1) on a side opposite the supporting structure. A connecting element (11) fastens the pressing element (5) on the supporting structure and imparts a force pressing towards the supporting structure. Sections (9, 10) formed on the pressing element (5) have outer edge regions (10) acting elastically on edge regions of the power module (1) in the fastened position. These edge regions are loaded with a pressing force towards the supporting structure. Such power modules (1) are useable with such fastening systems, as are the pressing elements (5).

20 Claims, 3 Drawing Sheets

(56) References Cited

U.S. PATENT DOCUMENTS

Figure 1:
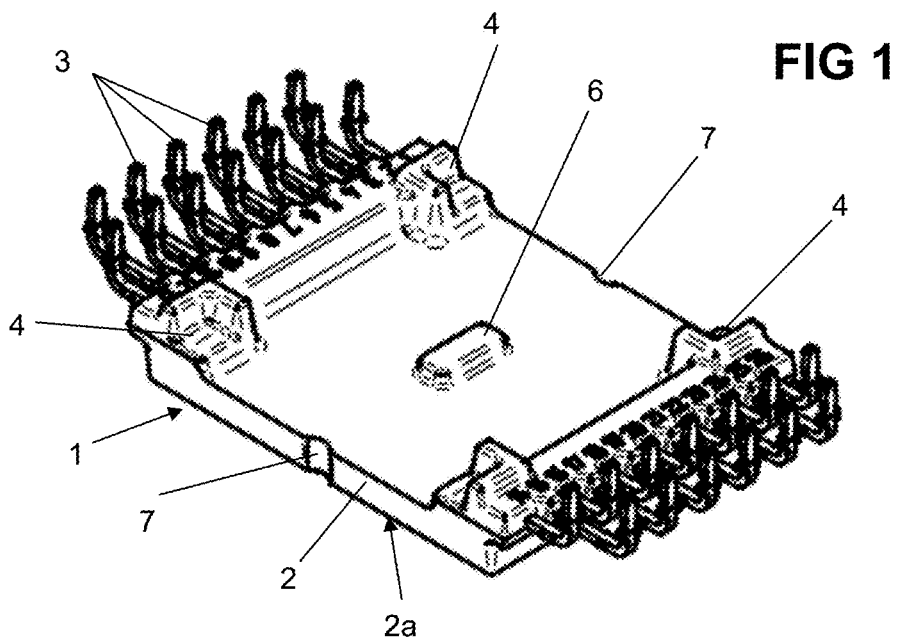

2006/0139890 A1* 6/2006 Liu .................... H01L 23/4093
361/719
2009/0168358 A1* 7/2009 Koike .................... H05K 7/209
361/709

FOREIGN PATENT DOCUMENTS

| EP | 2261971 | A1 | 12/2010 |
|----|---------|-----|---------|
| EP | 2927954 | A1 | 10/2015 |
| FR | 2931523 | A1 | 11/2009 |
| JP | S59-063735 | A | 4/1984 |
| JP | S59-099743 | A | 6/1984 |
| JP | 2004-087552 | A | 3/2004 |
| JP | 2011-035265 | A | 2/2011 |
| WO | 2008/131713 | A2 | 11/2008 |

OTHER PUBLICATIONS

EPO search report and written opinion from priority EPO application EP14163131, dated Oct. 15, 2014 (in German).

* cited by examiner

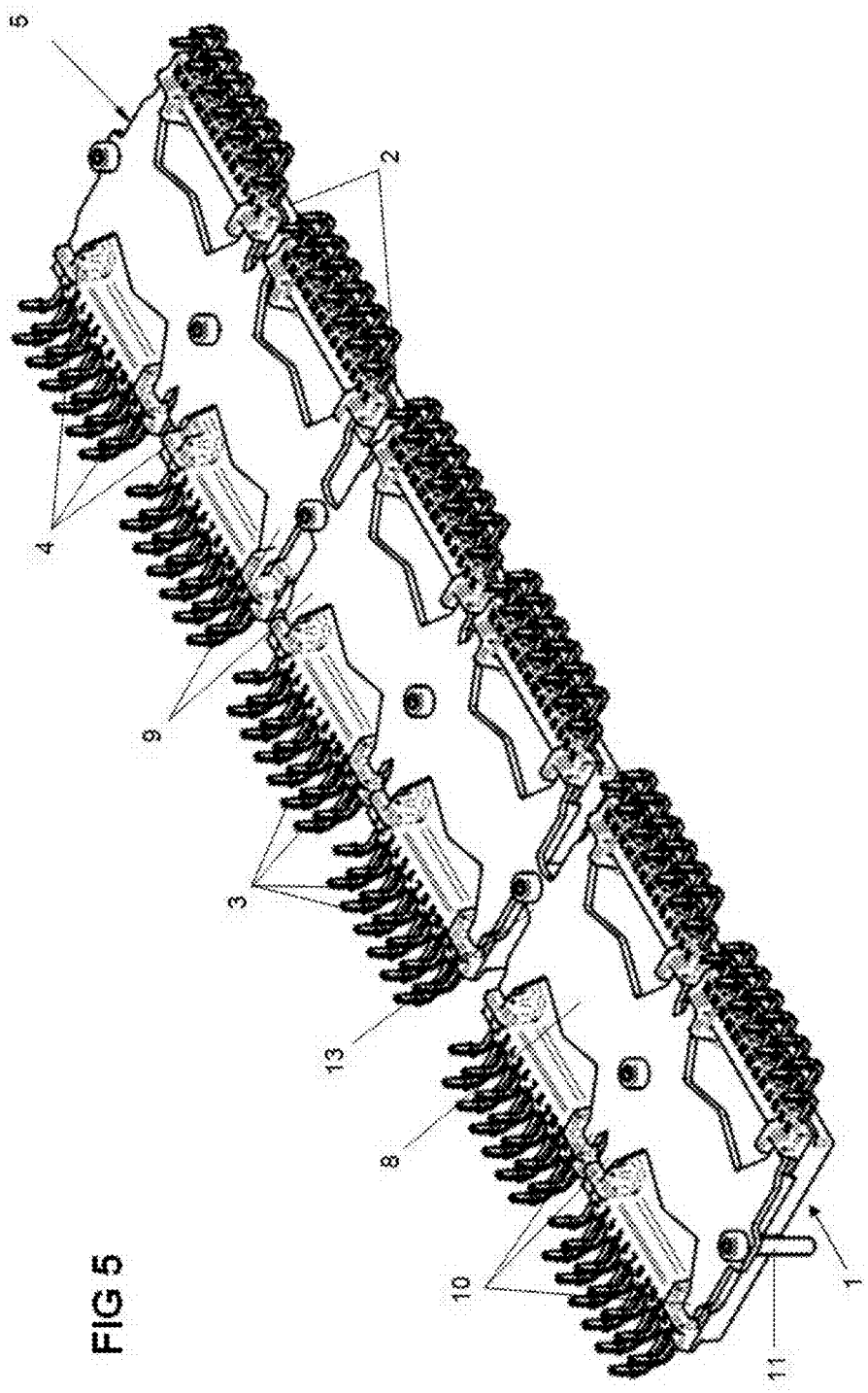

FASTENING SYSTEMS FOR POWER MODULES

This application claims benefit of priority to prior European (EPO) application no. EP14163131 filed on Apr. 2, 2014, and the entirety of this European application no. EP14163131 is expressly incorporated herein by reference in its entirety and as to all its parts, for all intents and purposes, as if identically set forth in full herein.

One or more disclosed embodiments relate to a fastening system for a power module and also a pressing element for use in such a fastening system.

A power module is a special type of integrated circuit (IC), in which for the purpose of controlling large current and voltages, correspondingly large housing, transistors and diodes are used. It typically consists of a moulded body with an essentially flat surface for bearing on a supporting structure and a plurality of contact pins protruding out of the moulded body. Due to the often high heat development, such power modules are typically constructed such that the heat is dissipated via a for example large-area metallised bearing surface and the connections of the power substrate and, depending on the layout and installation location, if appropriate via a thermally conductive intermediate layer to the supporting structure and/or to a heat sink. The smallest unevennesses between power module and supporting structure or heat sink can be compensated or the thermal resistance can be reduced using films or thermally conductive pastes.

As in the case of conventional ICs, the semiconductor chips are wired in power modules using bond wires. In conventional power modules, the semiconductor chips and bond wires are cast (moulded) with a soft silicone compound. More technically advanced power modules, which are constructed as a moulded module, are hard cast, like conventional ICs. Owing to the production process, the reverse side of the moulded modules is not perfectly flat however, rather it is curved outwards slightly from the centre. It is no longer possible to compensate this curvature by means of films, pastes or the like, so that the power modules are frequently pressed against the supporting structure or the heat sink by pressing elements. These pressing elements are typically rigid, for the most part elongated plates, whereby foam mats must be inserted between pressing element and power module to distribute the pressure and prevent, local pressure peaks, which increases the outlay for the components and the manufacturing considerably.

It is therefore the object of the present invention to specify a fastening system for one or a plurality of power modules, which, whilst preventing the above-mentioned disadvantages, ensures the secure and simple fastening, which is optimised in relation to the heat transfer from the power module to the supporting structure. Further objects of the invention are a power module and/or pressing element optimised for use with this fastening system.

According to the invention, sections are formed on the pressing element, the outer edge regions of which act elastically on edge regions of the power module in the fastened position of power module and pressing element and load these edge regions with a pressing force. Thus, the power module is loaded with the hold-down or pressing force exclusively at the sections, which are most prominently curved out of the ideal plane of the housing, namely the corner regions. In the remaining regions, the module remains exposed and is not contacted by the pressing element, so that no protective spacers, mats or the like whatsoever have to be provided. Also, the pressing element offers a satisfactory prestress force onto the housing of the module, so that even from this standpoint, mats are not required for pressure equalisation—as in the case of rigid plates as pressing elements. Only by means of the action on the highly curved corners is the housing of the moulded module brought to a flat shape between the supporting structure thereof and the pressing element, in which shape it bears evenly over the entire surface on the supporting structure. Thus, on the one hand, it is secured against undesired movements and on the other hand, the heat transfer to the supporting structure and/or a heat sink is ensured via the maximum available area.

Preferably, fastening sections for at least one connecting element in each case are provided on two opposite edge regions of the pressing element, preferably in a contact-pin-free edge region of the power module. Thus, on the one hand, the mounting and unmounting of the pressing element is not prevented by the contact pins or the same cannot be damaged in the context of mounting or unmounting. Moreover, the space conditions at the contact-pin-free sides or edge regions of the power module are most beneficial for the positioning of fastening elements.

According to a further preferred embodiment, it is provided that the fastening sections are formed at the pressing element by tabs projecting above the power module, with bores for accommodating connecting elements, preferably in the form of screws. This type of fastening is simple in terms of manufacturing, mounting and also unmounting, for example in the case of a required replacement of the power module.

In this case, a variant that is simple to produce and easily accessible for mounting and unmounting provides that the sections formed on the pressing element are constructed as tongue- or tab-shaped sections, which preferably emanate from a central region of the pressing element.

By contrast, an alternative embodiment of the invention is characterised in that the sections formed on the pressing element are constructed as edge strips running along an edge region of the power module, as a result of which the pressing force can be further distributed and applied more evenly onto the power module. In order, in the process, to ensure the symmetry of the force action, the edge regions applying the pressing force are preferably arranged on two opposite sides of the pressing element. A preferred arrangement of the sections applying the pressing force in an edge region with contact pins offers the advantage that the contact pins are additionally positioned as accurately as possible for secure contacting and held securely and non-displaceably for improved pressing action onto the edge regions of the power module.

An advantageous embodiment of the fastening system according to the invention in a variant, for a plurality of power modules is characterised in that the pressing element encompasses a plurality of power modules and at least one fastening section is provided for at least one connecting element in a region between two adjacent power modules. Thus, also possible for an arrangement of a plurality of power modules arranged one behind the other in a row is the attachment on a supporting structure and/or a heat sink, which attachment is advantageously secure and presses the power modules into a flat shape. By means of the fastening and therefore also the possibility of introducing the pressing force between two adjacent power modules, the same pressing action can be ensured for all power modules, without it being possible for individual power modules to be loaded too heavily and therefore perhaps damaged. On the other hand, too low a pressing action onto individual power modules, particularly those located in the centre of the row, is also prevented thereby.

A power module for use with a fastening system according to one of the above paragraphs typically consists of a moulded body with an essentially flat surface for bearing on a supporting structure and a plurality of contact pins protruding out of the moulded body. To achieve the object set at the beginning, the power module is characterised in that receptacles for sections of a pressing element are provided in the edge region of the moulded body. In power modules with an angular moulded body, these receptacles are preferably provided at corners of the power module distributed symmetrically around the centre of the moulded body. Thus, a force introduction, which is as even as possible, into the power module and the even pressing action onto the supporting structure can be achieved.

In an advantageous embodiment of the power module, the receptacles are raised in relation to the central region of the moulded body, which is provided, if appropriate, with a further elevation, which preferably central elevation at most reaches the height of the receptacles with respect to the central region of the moulded body. Due to this geometric shaping, all regions of the moulded body free from contacts and therefore protected from damage by the pressing element, except the regions, in which the pressing element can exert the optimum action onto the moulded body. A central elevation on the moulded body can on the other hand be used as a safety stop against too strong a prestress of the pressing element during the arrangement of the power module on the supporting structure, so that the pressing force is limited, in order to prevent damage of the moulded body and/or the fastening system.

In order to ensure a space-saving attachment of the fastening system, the moulded body advantageously has at least one recess or through opening in the contact-pin-free edge region and/or a through opening within the edge regions.

A pressing element according to the invention for use in a fastening system as described above is characterised by external sections, the outer edge regions of which act elastically on edge regions of the power module in the fastened position of power module and pressing element. Thus, the pressing action and pressing direction can be decoupled up to a certain degree from the fastening of the pressing element, and, in principle, the application point of the pressing force can be chosen independently of the fastening points.

At least the edge regions of a further embodiment of the pressing element, which come into contact with the power module, are curved towards the power module. As a result, if required, the achievable pressing force can be increased.

A further embodiment of a pressing element according to the invention is characterised in that the sections formed on the pressing element are constructed as edge strips extending along an edge region of the power module. Preferably, these edge strips lie on two opposite sides of the pressing element, in order to thereby achieve an evenly distributed introduction of force into the moulded body of the power module. Alternatively or additionally to the previous feature, the sections of the pressing element preferably lie in an edge region with contact pins. As a result, these contact pins are held securely, non-displaceably and in a precisely defined position.

Further advantages, features and details of the invention result from the following description, in which exemplary embodiments of the invention are described with reference to the drawings. In this case, the features mentioned in the claims and in the description may in each case be important for the invention individually per se or in any desired combination.

The reference list is part of the disclosure. The figures are described in a cohesive and comprehensive manner. The same reference symbols denote the same components, reference symbols with different indices specify functionally identical or similar components.

Figure 2:
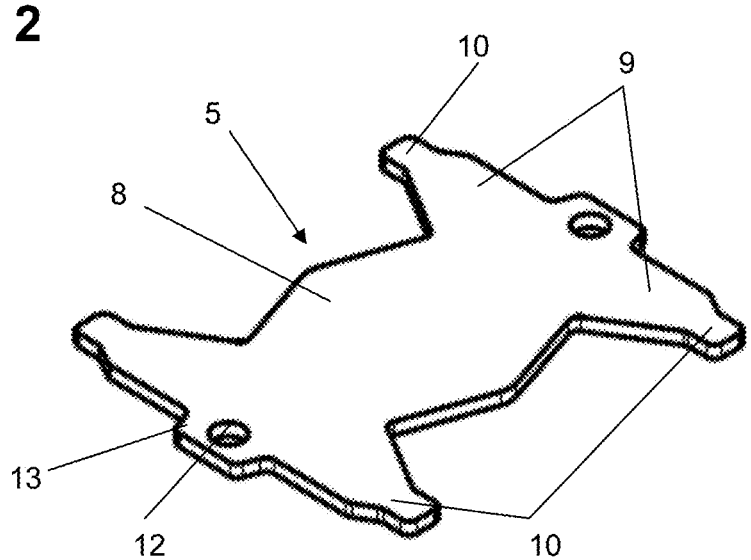
Figure 3:
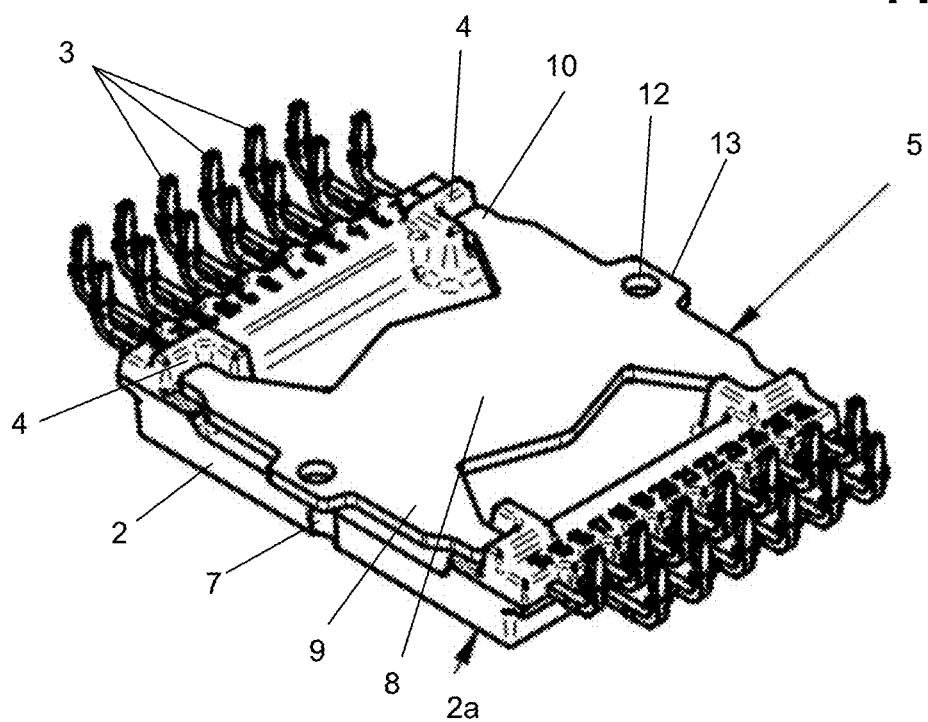
Figure 4:
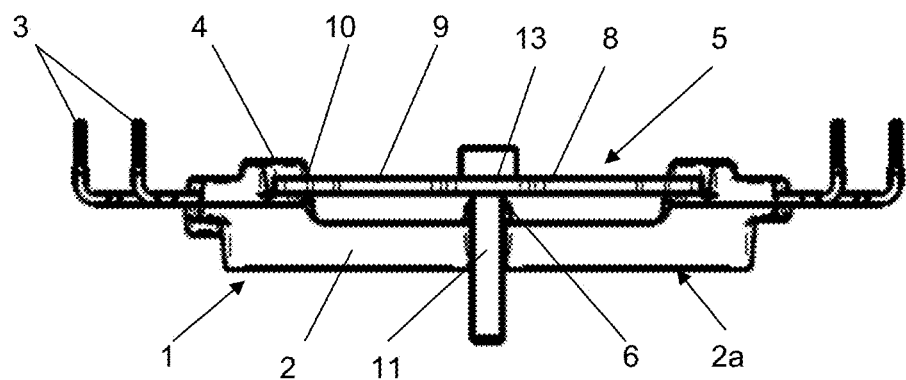

In the figures:

FIG. 1 shows a power module in a preferred embodiment for use with the fastening system according to the invention in a perspective view, FIG. 2 shows a pressing element in a preferred embodiment for use with the fastening system according to the invention in a perspective view, FIG. 3 shows the power module of FIG. 1 and the pressing element of FIG. 2 in interactive arrangement in the context of the fastening system according to the invention, FIG. 4 shows a side view of the arrangement of FIG. 3 from a direction parallel to the edge regions with the contact pins, and FIG. 5 shows a perspective view of an arrangement of a plurality of power modules with a common pressing element according to the invention.

FIG. 1 shows a power module 1 with a moulded body 2 and contact pins 3, which lead outwards from the circuit typically cast in the moulded body 2 and are preferably equally sized. For large currents, two or a plurality of contact pins 3 can also be connected in parallel, or contact pins 3 can be omitted for increasing the air gaps and creep paths. In the interior of the moulded body 2, the semiconductor chips are wired with bond wires and either cast with a soft silicone compound or hard cast in more technically advanced power modules 1, which are constructed as moulded modules. The bond wires can no longer wobble due to the hard casting, thus there are no fatigue fractures and the vibration problem is overcome.

The contact pins 3 are preferably constructed as press-in pins, in the case of which no tin whisker problems occur, as in the case of highly energised, lead-free soldered pins. The contact pins 3 preferably lie in two offset rows, in order to be able to realise satisfactory spacings in spite of the compact construction (pin spacing e.g. only 3 mm). Thus, the power module 1 can also be used for higher voltages (for example up to 1000 VDC).

Power modules of this type have a markedly increased reliability and also service life compared to conventional power modules. Owing to the reduced complexity of the inner structure and production process, power modules of this type are also simpler and less expensive to manufacture. In this case, the design of the moulded body 2 and the arrangement of the contact pins 3 is the same for all variants of the power module 1, so that a type of "generic housing" is created. The design and location of the connections is always the same and the interior can be adapted, depending on the object and purpose.

A specific problem in the hitherto known power modules the fastening thereof, which had to be solved individually almost every time. This is where the fastening system according to the invention comes in and offers a novel, advantageous solution.

As can be seen in FIG. 1, a power module 1 to be used with the fastening system according to the invention is provided with a moulded body 2, which is constructed with an essentially flat bearing surface 2a for bearing on a supporting structure. On the side of the moulded body 2 opposite the supporting structure—or else a heat sink or the like—receptacles 4 for sections of a pressing element. 5 (see FIG. 2) are typically provided in the edge region of the moulded body 2 in power modules 1 with an angular moulded body 2—like that in FIG. 1—these receptacles 4 are preferably arranged at corners of the power module 1 distributed at least symmetrically around the centre of the moulded body 2.

The receptacles 4 are in this case preferably arranged in an elevated manner with respect to the central region of the moulded body 2. If appropriate, a further elevation 6 is preferably arranged in the central region of the moulded body. In this case, this preferably reaches the height of the receptacles 4 at most with respect to the central region of the moulded body 2. In order to negatively influence the symmetry of the force introduction by the pressing element 5 into the moulded body 2 as little as possible, the further elevation 5 is typically arranged centrally on the moulded body 2.

Finally, the moulded body 2 can also be provided with at least one recess 7 on the outer contact-pin-free edge region, for example in the case of a semicircular groove or milled recess, which is outwardly open. Preferably likewise in the contact-pin-free edge region of the moulded body 2, at best if allowed by the arrangement of the semiconductor chips in the interior of the moulded body 2, a through opening with preferably circular cross section could also be present preferably for passing through fastening elements or the like.

FIG. 2 shows a pressing element 5 according to the invention for use in a fastening system for power modules 1, as described above. It has outer sections 9 emanating from a central region 8. These sections 9 merge into outer edge regions 10, which are present in a geometric arrangement of this type—preferably mirror- or point-symmetrically about an axis or the centre of the pressing element 5—such that they come to lie in the receptacles 4 of the moulded body 2 when the pressing element 5 rests on the power module 1. If the pressing element 5 is then loaded with a force in the direction of the power module 1 or the supporting structure located therebelow by suitable connecting elements 11 (see FIG. 4), such as screws for example, the edge regions 10 are pressed against the receptacles 4 and effect a pressing force onto the power module 1 directed through the receptacles 4 towards the supporting structure. The force action takes place in an elastic manner in this case. The pressing action and the pressing direction can be decoupled to a certain extent from the fastening of the pressing element 5 and the points of action of the pressing force can be chosen independently of the fastening points by means of the precise shape and orientation of the outwardly facing sections 9 and the outer edge regions 10 of the pressing element 5.

To fasten the pressing element 5 on the supporting structure or a heat sink or the like by means of the already mentioned connecting elements 11, recesses for inserting the connecting element 11 or preferably through openings 12 with preferably circular cross section are arranged at the edges of the pressing element 5, preferably those edges, which run parallel to the contact-pin-free edges of the power module 1. Preferably therefore, fastening sections 13 emerge from the central region 8 of the pressing element 5, advantageously in the form of tabs or tongues, preferably for at least one connecting element 11 in each case on the two opposite edge regions of the pressing element 5. Advantageously, the through openings 12 of the pressing element 5 is positioned in these fastening sections 13 in such a manner that the connecting element 11 runs through the recess 7 of the moulded body 2.

The mode of action of the fastening system according to the invention can easily be drawn from the FIGS. 3 and 4. The outer sections 10 of the pressing element 5, which is placed covering the moulded body 2 of the power module 1 on the upper side thereof, engage into the receptacles 4 of the moulded body 2. These outer sections 10 are preferably accommodated there in a positive-fitting manner at least to some extent and after fastening the pressing element 5 act elastically on the edge regions of the power module 1 with the receptacles 4. The pressing element 5 acts exclusively in this manner on the sections of the moulded body 2 that are curved most strongly out of the ideal plane or the contact plane with the supporting structure or a heat sink, namely on the corner regions. These regions of the power module 1 are loaded in a locally delimited manner with the hold-down or pressing force. In this manner, it is possible to press the moulded body 2 into a flat shape, in which the underside of the moulded body 2 rest evenly on the supporting structure over the entire surface of the underside.

For an arrangement of a plurality of power modules 1, which are present in a straight row one behind the other, with the rows of the contact pins 3 likewise in a straight line one behind the other, a pressing element 5a encompassing a plurality or even all the power modules 1 arranged in rows can be provided. At least one fastening section 13 with a bore 12 for a connecting element 11 is provided in a region between two adjacent power modules 1. Thus, the pressing force can be transferred evenly onto the power modules 1. When configuring the power modules 1 with the recesses 7 or through openings for the connecting elements 11, the moulded bodies 2 can be positioned lying very close to one another.

At least the edge regions 9, 10 of the pressing element 5 coming into contact with the power module 1 could be curved towards the power module 1, in order to increase the pressing force as a result, if required. However, the pressing element 5 is typically completely flat and, if at all, has a curvature in the form of a flexion towards the moulded body 2 of the power module 1 only after the tensioning with the supporting structure. However, in order to limit this flexion and therefore also the maximum possible pressing force and to keep the pressing element 5 distanced as much as possible from the moulded body 2, the central elevation 6 can be used on the moulded body 2 as a spacer element and/or stop element, as can be seen in FIG. 4.

Instead of the tongue- or tab-shaped sections 9, 10 of the pressing element 5, according to a different embodiment according to the invention, the sections formed on the pressing element 5 can be constructed as edge strips extending along an edge region of the power module 1, preferably an edge region with contact pins 3.

Preferably, these edge strips lie on two opposite sides of the pressing element 5, and therefore also the power module 1.

LIST OF REFERENCE LABELS

1 Power module
2 Moulded body
2a Contact surface
3 Contact pins
4 Receptacle
5 Pressing element
6 Central elevation
7 Recess
8 Central region
9 Outer section 10 Outer edge region
11 Connecting element
12 Bore
13 Fastening section

The invention claimed is:
1. A power module fastening system comprising:
a power module moulded body, said moulded body having a bearing surface configured to bear on a support, said moulded body having a second surface opposite said bearing surface, said second surface having a plurality of receptacles, said receptacles being situated at edge regions of said second surface;
a press plate configured to contact said second surface, said press plate including a plurality of extending sections, each of said extending sections having at least one respective outer edge portion, each of said respective outer edge portions of said extending sections being received in at least one respective receptacle of said second surface; and,
a connector configured to mount said press plate in contact with said second surface to push said bearing surface onto the support in a fastened position.

2. A power module fastening system as claimed in claim 1, further comprising:
a central region of said second surface, said central region having an elevated portion, said elevated portion having a maximum height not exceeding a maximum height of said plurality of receptacles relative to said central region.

3. A power module fastening system as claimed in claim 1, further comprising:
at least one through opening in an end region of said moulded body.

4. The power module fastening system as claimed in claim 1, wherein:
at least one respective outer edge portion of at least one of said plurality of extending sections is curved towards said second surface.

5. A power module fastening system as claimed in claim 1, further comprising:
at least one fastening section tab provided on said press plate, said fastening section tab having a bore through which said connector passes.

6. The power module fastening system as claimed in claim 1, wherein:
at least one of said extending sections of said press plate is formed as a tongue, said tongue extending from a central region of said press plate.

7. The power module fastening system as claimed in claim 1, wherein:
said extending sections are all constructed as edge strips, said edge strips extending along at least one edge region of said moulded body.

8. A power module fastening system as claimed in claim 1, further comprising:
said press plate having a press plate fastening section configured to extend towards another power module moulded body.

9. The power module fastening system as claimed in claim 1, wherein:
said moulded body has a polygonal layout including symmetrically distributed corners, and each of said receptacles being respectively situated at a respective corner of said moulded body.

10. A power module fastening system comprising:
a power module moulded body, said moulded body having a bearing surface configured to bear on a support, said moulded body having a second surface opposite said bearing surface, said second surface having edge regions;
a press plate having length spanning across and beyond opposite edge regions of said second surface, said press plate having a central portion along its length spanning across said second surface;
a plurality of laterally extending sections each respectively laterally extending from said central portion of said press plate, each of said extending sections having at least one respective outer edge portion, each of said respective outer edge portions of said extending sections respectively contacting said second surface at a respective edge region of said second surface; and,
a first connector configured to mount said press plate in contact with said second surface to push said bearing surface onto the support in a fastened position.

11. A power module fastening system as claimed in claim 10, further comprising:
a second connector configured to mount said press plate in contact with said second surface to push said bearing surface onto the support in a fastened position.

12. A power module fastening system as claimed in claim 10, further comprising:
a fastening section tab provided on said press plate at a location beyond an edge region of said second surface, said fastening section tab having a bore through which said first connector passes.

13. A power module fastening system as claimed in claim 10, further comprising:
said press plate having a press plate fastening section configured to extend towards another power module moulded body.

14. The power module fastening system as claimed in claim 10, wherein:
each of said plurality of laterally extending sections includes at least one respective tongue.

15. The power module fastening system as claimed in claim 14, wherein:
each of said tongues respectively having at least one of said outer edge portions, and at least one of said outer edge portions is curved towards said second surface.

16. The power module fastening system as claimed in claim 10, wherein:
said laterally extending sections are all constructed as edge strips, said edge strips extending along edge regions of said moulded body.

17. A power module fastening system as claimed in claim 10, further comprising:
a plurality of receptacles included on said second surface, said receptacles being situated at said edge regions of said second surface, and each of said respective outer edge portions of said extending sections being received in at least one respective receptacle of said second surface.

18. The power module fastening system as claimed in claim 17, wherein:
said moulded body has a polygonal layout including symmetrically distributed corners, and each of said receptacles is respectively situated at a respective corner of said moulded body.

19. A power module fastening system as claimed in claim 17, further comprising:
a central region of said second surface, said central region having an elevated portion, said elevated portion having a maximum height not exceeding a maximum height of said plurality of receptacles relative to said central region.

20. A power module fastening system as claimed in claim 10, further comprising:
a through opening in an end region of said moulded body, said through opening receiving said first connector.

* * * * *